US012604730B2

(12) United States Patent
Wang et al.

(10) Patent No.:  US 12,604,730 B2
(45) Date of Patent:      Apr. 14, 2026

(54) CHIP PACKAGING STRUCTURE AND PREPARATION METHOD THEREFOR

(71) Applicants:NATIONAL CENTER FOR ADVANCED PACKAGING CO., LTD., Wuxi (CN); SHANGHAI XIANFANG SEMICONDUCTOR CO., LTD., Shanghai (CN)

(72) Inventors: Quanlong Wang, Wuxi (CN); Peng Sun, Wuxi (CN); Liqiang Cao, Wuxi (CN)

(73) Assignees: NATIONAL CENTER FOR ADVANCED PACKAGING CO., LTD., Wuxi (CN); SHANGHAI XIANFANG SEMICONDUCTOR CO., LTD., Shanghai (CN)

( * ) Notice: Subject to any disclaimer, the term of this patent is extended or adjusted under 35 U.S.C. 154(b) by 360 days.

(21) Appl. No.:    18/286,350

(22) PCT Filed:    May 9, 2022

(86) PCT No.:      PCT/CN2022/091689
§ 371 (c)(1),
(2) Date:       Oct. 10, 2023

(87) PCT Pub. No.: WO2022/257678
PCT Pub. Date: Dec. 15, 2022

(65) Prior Publication Data
US 2024/0203865 A1      Jun. 20, 2024

(30) Foreign Application Priority Data
Jun. 7, 2021    (CN) ......................... 202110633653.3

(51) Int. Cl.
H10W 20/40       (2026.01)
H10W 20/41       (2026.01)
(Continued)

(52) U.S. Cl.
CPC ....... *H10W 20/496* (2026.01); *H10W 20/427* (2026.01); *H10W 70/685* (2026.01);
(Continued)

(58) Field of Classification Search
CPC ............. H10W 20/496; H10W 44/601; H10W 70/685; H10W 90/00; H10W 90/701;
(Continued)

(56) References Cited

U.S. PATENT DOCUMENTS 10,790,225 B1    9/2020  Xi et al.
11,257,765 B2    2/2022  Xi et al.
(Continued)

FOREIGN PATENT DOCUMENTS

CN        109994438 A      7/2019
CN        110010597 A      7/2019
CN        113380772 A      9/2021

*Primary Examiner* — Thanhha S Pham
(74) *Attorney, Agent, or Firm* — Maschoff Brennan

(57) ABSTRACT

Provided in the present application are a chip packaging structure and a preparation method therefor. The chip packaging structure comprises a substrate, a chip, an insulating layer, a capacitor structure and a packaging layer. According to the chip packaging structure and the packaging method therefor provided in the present application, a capacitor structure is packaged on a surface and a lateral wall of a chip, such that the capacitor structure is applied in packaging, thereby improving the level of integration of the chip. In the present application, a first electrode layer, a second electrode layer and a capacitive dielectric layer all extend along a surface on a side of a chip facing away from a substrate and along a lateral wall of the chip. Therefore, a larger relative area of the first electrode layer and the second electrode layer can be obtained, which can improve the capacity of a capacitor.

9 Claims, 4 Drawing Sheets

(51) Int. Cl.
*H10W 70/685* (2026.01)
*H10W 90/00* (2026.01)
*H10W 74/00* (2026.01)

(52) U.S. Cl.
CPC ......... *H10W 90/00* (2026.01); *H10W 90/701* (2026.01); *H10W 74/00* (2026.01); *H10W 90/732* (2026.01); *H10W 90/734* (2026.01); *H10W 90/792* (2026.01); *H10W 90/794* (2026.01)

(58) Field of Classification Search
CPC ... H10W 74/00; H10W 90/732; H10W 90/73; H10W 90/792; H10W 90/794; H10W 72/30; H10W 72/00; H10W 74/014
See application file for complete search history.

(56) References Cited

U.S. PATENT DOCUMENTS

| 2009/0237900 | A1 | | 9/2009 | Origuchi et al. | |
| 2012/0261832 | A1 | | 10/2012 | Takano et al. | |
| 2023/0317641 | A1 | * | 10/2023 | Lai ..................... | H10W 74/014 |
| | | | | | 257/690 |
| 2023/0420373 | A1 | * | 12/2023 | Duong ................. | H10W 70/65 |

* cited by examiner

CHIP PACKAGING STRUCTURE AND PREPARATION METHOD THEREFOR

This application claims priority to Chinese patent application No. 202110633653.3, with the China National Intellectual Property Administration on Jun. 7, 2021 and entitled "CHIP PACKAGING STRUCTURE AND PACKAGING METHOD THEREFOR", the disclosure of which is hereby incorporated by reference in its entirety.

TECHNICAL FIELD

The present application relates to the technical field of chip packaging, and in particular to a chip packaging structure and a packaging method therefor.

BACKGROUND

Power integrity is of great importance in today's electronic products. Power integrity is embodied at various levels, which include a chip level, a chip package level, a circuit board level and a system level. Currently, in mobile terminals and high-performance computing applications, power integrity is becoming more and more important as the operating current of a chip increases and the clock frequency increases.

In order to address power integrity at the package level, several different integration schemes are proposed. Currently, the capacitor structure is arranged separately on the circuit board and is therefore poorly integrated; due to the small space of the chip and the limited space occupied by the separately arranged capacitor structure, it does not allow for a large capacitance.

SUMMARY OF THE INVENTION

Therefore, the technical problem to be solved by the present application is to overcome the defects of a low level of integration and small capacitance of the prior packaging structure, thereby providing a chip packaging structure and a packaging method therefor.

In a first aspect, the present application provides a chip packaging structure, comprising: a substrate; a chip, which is arranged on the substrate; and a capacitor structure, which comprises a first electrode layer and a second electrode layer that are arranged opposite to each other and a capacitive dielectric layer that is located between the first electrode layer and the second electrode layer, wherein the first electrode layer, the second electrode layer and the capacitive dielectric layer all extend along a surface on a side of the chip facing away from the substrate and along a lateral wall of the chip.

Optionally, the capacitor structure forms a decoupling capacitor; the first electrode layer is configured to receive a power source signal, and the second electrode layer is configured to receive a grounding signal; or the second electrode layer is configured to receive a power source signal, and the first electrode layer is configured to receive a grounding signal.

Optionally, the substrate comprises a redistribution structure, and the redistribution structure comprises a redistribution layer; the first electrode layer is electrically connected to the chip via the redistribution layer; and the second electrode layer is electrically connected to the chip via the redistribution layer.

Optionally, the chip packaging structure further comprises an insulating layer, which covers the lateral wall of the chip and the surface on the side of the chip facing away from the substrate and extends to a surface of part of the redistribution structure on a lateral side of the chip, wherein the insulating layer is located between the capacitor structure and the chip, and the first electrode layer is located between the insulating layer and the capacitive dielectric layer.

Optionally, the first electrode layer comprises a first connection part, which is located on the lateral side of the chip and is arranged opposite to the redistribution structure; and the chip packaging structure further comprises a first connector, which extends through the insulating layer and is located at the bottom of the first connection part, wherein one end of the first connector is connected to the first connection part and the other end thereof is connected to the redistribution layer.

Optionally, the second electrode layer comprises a second connection part, which is located on the lateral side of the chip and is arranged opposite to the redistribution structure; and the chip packaging structure further comprises a second connector, which extends through both the capacitive dielectric layer and the insulating layer and is located at the bottom of the second connection part, wherein one end of the second connector is connected to the second connection part and the other end thereof is connected to the redistribution layer.

Optionally, the chip packaging structure further comprises solder balls, which are arranged on a side of the redistribution layer facing away from the chip.

Optionally, the chip is connected to the solder balls via the redistribution layer, the solder balls are connected to a power source module, the power source module is configured to output a power source signal to some of the solder balls, and the power source module is configured to output a grounding signal to some of the solder balls.

Optionally, the chip is mounted upside down on the substrate.

In another aspect, the present invention provides a packaging method, comprising: preparing a substrate; surface-mounting a chip on the substrate; and forming a capacitor structure, wherein a process for forming the capacitor structure comprises: forming a first electrode layer; forming a second electrode layer; and forming a capacitive dielectric layer between the step of forming the first electrode layer and the step of forming the second electrode layer, wherein the first electrode layer, the second electrode layer and the capacitive dielectric layer all extend along a surface on a side of the chip facing away from the substrate and along a lateral wall of the chip.

Optionally, the substrate comprises a redistribution structure, and the redistribution structure comprises a redistribution layer; the first electrode layer is electrically connected to the chip via the redistribution layer; and the second electrode layer is electrically connected to the chip via the redistribution layer.

Optionally, prior to the step of forming the capacitor structure, the method further comprises: forming an insulating layer, which covers the lateral wall of the chip and the surface on the side of the chip facing away from the substrate and extends to a surface of part of the redistribution structure on a lateral side of the chip; and forming, in the insulating layer on the lateral side of the chip, a first connector that extends through the insulating layer, the first connector being connected to the redistribution layer, wherein in the step of forming the first electrode layer, the first electrode layer comprises a first connection part, which is located on the lateral side of the chip, is arranged opposite to the redistribution structure, and is located on a surface of the first connector.

Optionally, the packaging method further comprises: in the step of forming the capacitive dielectric layer, the capacitive dielectric layer extending to the surface of part of the insulating layer on the lateral side of the chip; the packaging method further comprises: forming, on the lateral side of the chip, a second connector that extends through both the capacitive dielectric layer and the insulating layer, the second connector being connected to the redistribution layer; and in the step of forming the second electrode layer, the second electrode layer comprises a second connection part, which is located on the lateral side of the chip, is arranged opposite to the redistribution structure, and is located on a surface of the second connector.

Optionally, the packaging method further comprises: forming solder balls on a side of the redistribution layer facing away from the chip.

Optionally, the step of surface-mounting the chip on the substrate is performed by mounting the chip upside down on the substrate.

The technical solutions of the present application have the following advantages:

The present invention provides a chip packaging structure and a packaging method therefor. A capacitor structure is packaged on a surface and a lateral wall of a chip, and the capacitor structure is applied in the packaging, thereby improving the level of integration of the chip. In the present application, a first electrode layer, a second electrode layer and a capacitive dielectric layer all extend along a surface on a side of the chip facing away from a substrate and along a lateral wall of the chip. Therefore, a larger relative area of the first electrode layer and the second electrode layer can be obtained, which can improve the capacity of a capacitor.

BRIEF DESCRIPTION OF DRAWINGS

The drawings required for use in the description of the specific embodiments or in the prior art will be briefly described hereinafter in order to more clearly explain the specific embodiments of the present application or the technical solutions in the prior art. It will be apparent that the drawings described herein are some embodiments of the present application, and other drawings may be obtained by a person of ordinary skill in the art from these drawings without any inventive effort.

BRIEF DESCRIPTION OF DRAWINGS

Figure 1:
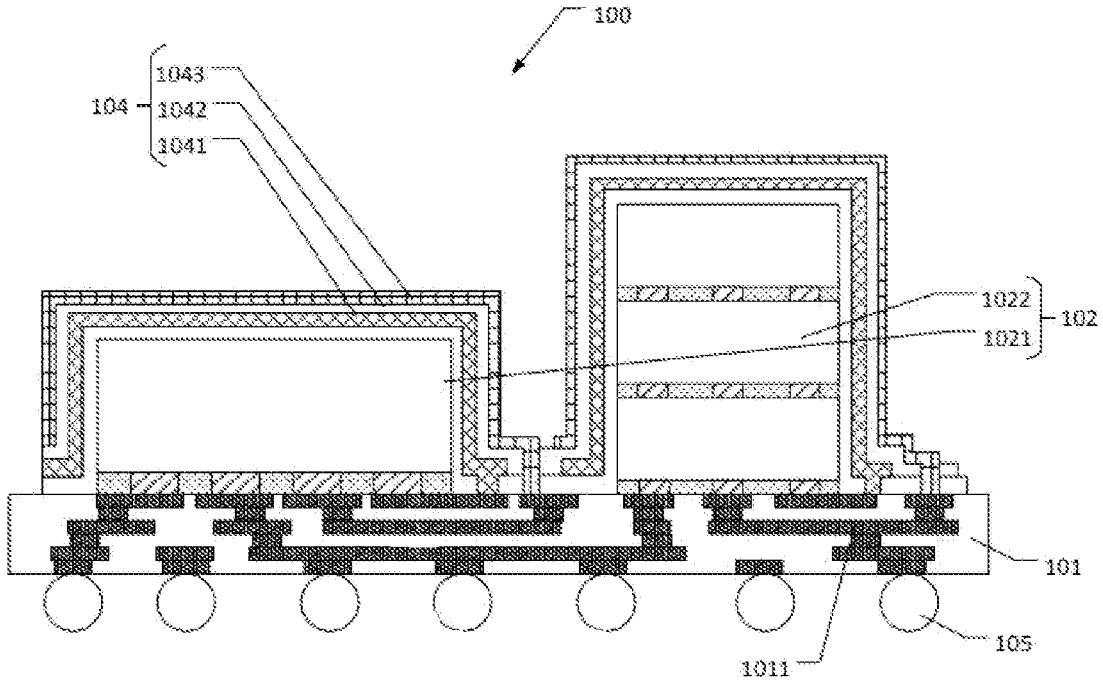
FIG. 1 is a schematic structure diagram of the chip packaging structure provided in the embodiments of the present application.

Chip packaging structure 100; substrate 101; chip 102; insulating layer 103;

Capacitor structure 104; packaging layer 106; solder ball 105; redistribution layer 1011;

Temporary carrier 110; first electrode layer 1041; capacitive dielectric layer 1042; second electrode layer 1043;

First connector 1031; second connector 1032; first chip 1021; second chip 1022.

DETAILED DESCRIPTION

The technical solutions of the present application will be clearly and completely described hereinafter with reference to the accompanying drawings. It is apparent that the described embodiments are merely some rather than all of the embodiments. On the basis of the embodiments in the present application, all other embodiments obtained by a person of ordinary skill in the art without any inventive effort shall fall within the scope of protection of the present application.

In the description of the present application, it should be noted that the orientations or positional relationships denoted by the terms "up", "down", "inside", "outside", etc. are based on those shown in the drawings, and these terms are merely intended for ease of description of the present application and simplification of the description, but are not intended to indicate or imply that the device or element referred to must have a particular orientation and be constructed and operated in a particular orientation, and therefore cannot be construed as limiting the present application. In addition, the terms "first" and "second" are used for descriptive purposes only and cannot be construed as indicating or implying relative importance.

In the description of this application, it should be noted that, unless expressly specified and limited otherwise, the terms "mounting", "mutual connection" and "connection" are to be understood broadly, for example, "connection" may be a fixed connection and may also be a detachable connection or an integral connection; "connection" may be a mechanical connection or an electrical connection; and "mutual connection" may be a direct mutual connection, and may also be an indirect mutual connection via an intermediate medium and communication between the interiors of two elements. For a person of ordinary skill in the art, the specific meanings of the above terms in the present application may be understood according to specific situations.

Furthermore, the technical features involved in various embodiments of the present application described below may be combined with each other as long as they do not contradict each other.

As shown in FIG. 1, an embodiment of the present application provides a chip packaging structure 100, comprising: a substrate 101, chips 102, insulating layers 103 and capacitor structures 104.

In this embodiment, the substrate 101 is of a redistribution structure. The redistribution structure comprises a redistribution layer 1011 and a dielectric layer covering the redistribution layer 1011.

In other embodiments, the substrate 101 may be another substrate 101 electrically connected to the chips 102.

Figure 3:
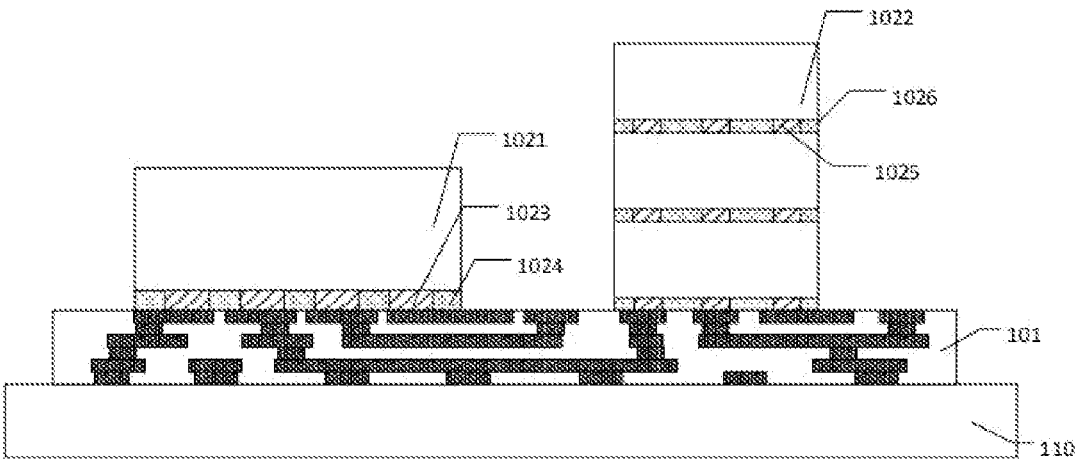
FIG. 3 is a schematic diagram of step S3 in the preparation method for the chip packaging structure provided in the embodiments of the present application.

Referring also to FIG. 3, the chips 102 are arranged on the substrate 101 and are connected to the substrate 101; a plurality of chips 102 may be provided, and the number of the chips 102 is not limited in this application; and in this embodiment, two chips 102 are provided, which are specifically a first chip 1021 and a second chip 1022. Referring also to FIG. 3, the first chip 1021 is of a single-layer chip structure, a plurality of first solder pads 1023 are provided on the front of the first chip 1021, the first solder pads 1023 are connected to the substrate 101, and a first adhesive layer 1024 is filled between the first solder pads 1023 and the substrate 101; and the second chip 1022 is of a stacked chip structure and comprises a plurality of stacked second sub-chips, second solder pads 1025 are provided on the front of the second sub-chip, adjacent second sub-chips are electrically connected via connectors that are arranged in the second sub-chips, and two ends of the connector are respectively connected to the second solder pads 1025 of the adjacent second sub-chips. A second adhesive layer 1026 is also filled between adjacent second sub-chips. In the figure, a three-layer silicon-based chip stack design is shown, and the second sub-chip at the bottommost layer is connected to the substrate 101 via the second solder pads 1025.

In this embodiment, the chips 102 are mounted upside down on the substrate 101. The first chip 1021 and the second chip 1022 are both mounted upside down on the substrate 101.

Continuing to refer to FIG. 1, the insulating layer 103 covers a lateral wall of the chip 102 and a surface on a side of the chip 102 facing away from the substrate 101 and extends to a surface of part of the redistribution structure on a lateral side of the chip 102. The insulating layer 103 is arranged between the capacitor structure 104 and the chip 102.

The capacitor structure 104 comprises a first electrode layer 1041, a capacitive dielectric layer 1042 and a second electrode layer 1043, wherein the first electrode layer 1041 and the second electrode layer 1043 are arranged opposite to each other, and the capacitive dielectric layer 1042 is located between the first electrode layer 1041 and the second electrode layer 1043. The first electrode layer 1041, the second electrode layer 1043 and the capacitive dielectric layer 1042 all extend along the surface on the side of the chip 102 facing away from the substrate 101 and along the lateral wall of the chip 102. Therefore, the capacitor structure 104 can obtain a larger area, which can improve the capacity of a capacitor.

When the capacitor structure 104 is used as a decoupling capacitor, the first electrode layer 1041 is configured to receive a power source signal, and the second electrode layer 1043 is configured to receive a grounding signal; or the second electrode layer 1043 is configured to receive a power source signal, and the first electrode layer 1041 is configured to receive a grounding signal. A decoupling capacitor is a capacitor that is mounted at a power end of an element in a circuit. This capacitor can provide a relatively stable power source, and meanwhile, can also reduce the noise caused by coupling the element to the power end, and indirectly reduce the influence of the noise of this element on other elements.

Figure 5:
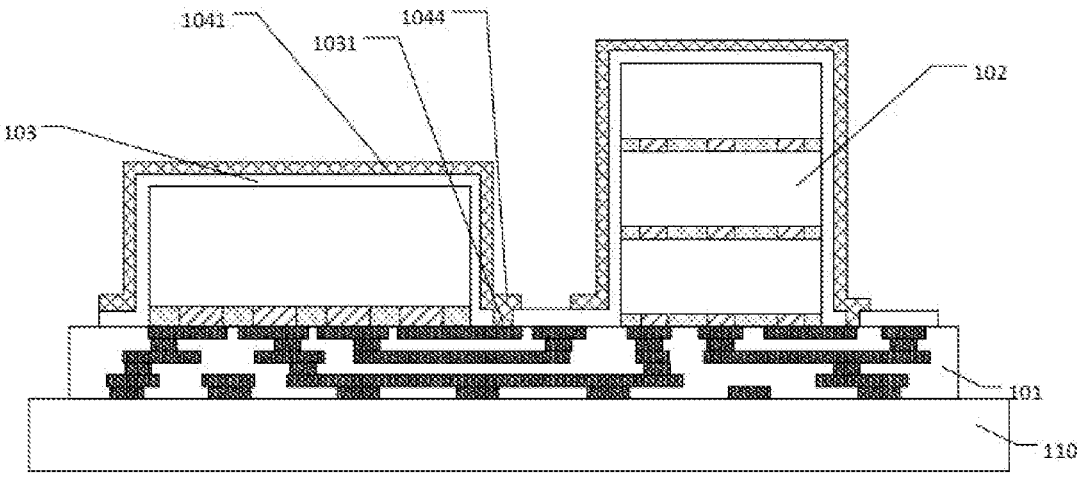
FIG. 5 is a schematic diagram of step S5 in the preparation method for the chip packaging structure provided in the embodiments of the present application.
Figure 6:
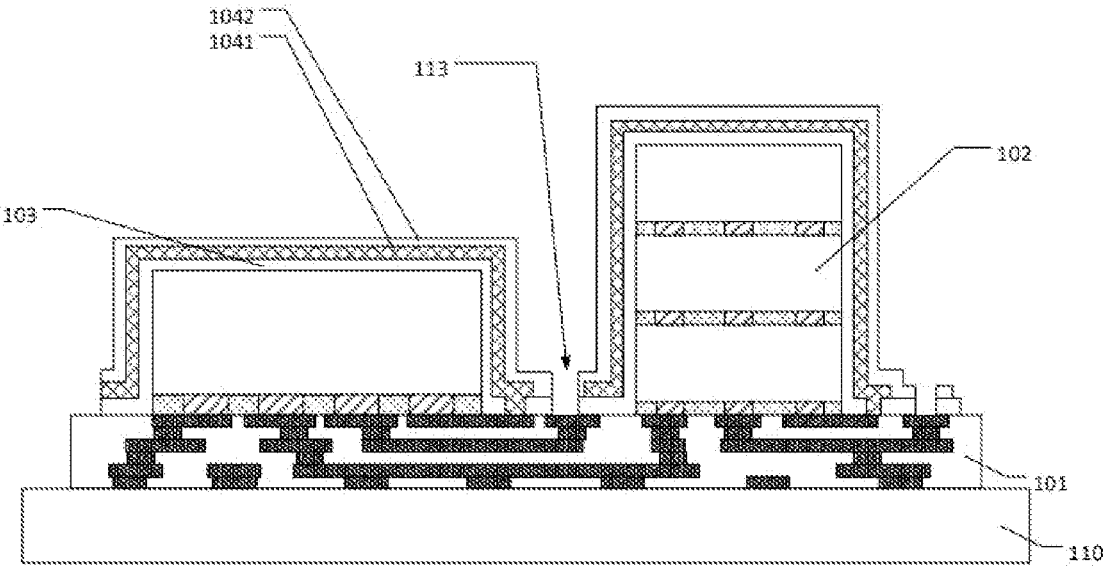
FIG. 6 is a schematic diagram of step S5 in the preparation method for the chip packaging structure provided in the embodiments of the present application.

The first electrode layer 1041 is arranged on an upper surface of the insulating layer 103, and the first electrode layers 1041 on adjacent chips 102 are separated from each other. The first electrode layer 1041 is electrically connected to the chip 102 via the redistribution layer 1011. Specifically, referring to FIG. 5 and FIG. 6, the first electrode layer 1041 comprises a first connection part 1044, which is located on the lateral side of the chip 102 and is arranged opposite to the redistribution structure; and the chip packaging structure further comprises first connectors 1031, each of which extends through the insulating layer 103 and is located at the bottom of the first connection part 1044, wherein one end of the first connector 1031 is connected to the first connection part 1044, and the other end of the first connector 1031 is connected to the redistribution layer 1011, such that the electrical connection between the first electrode layer 1041 and the chip 102 is achieved.

Figure 7:
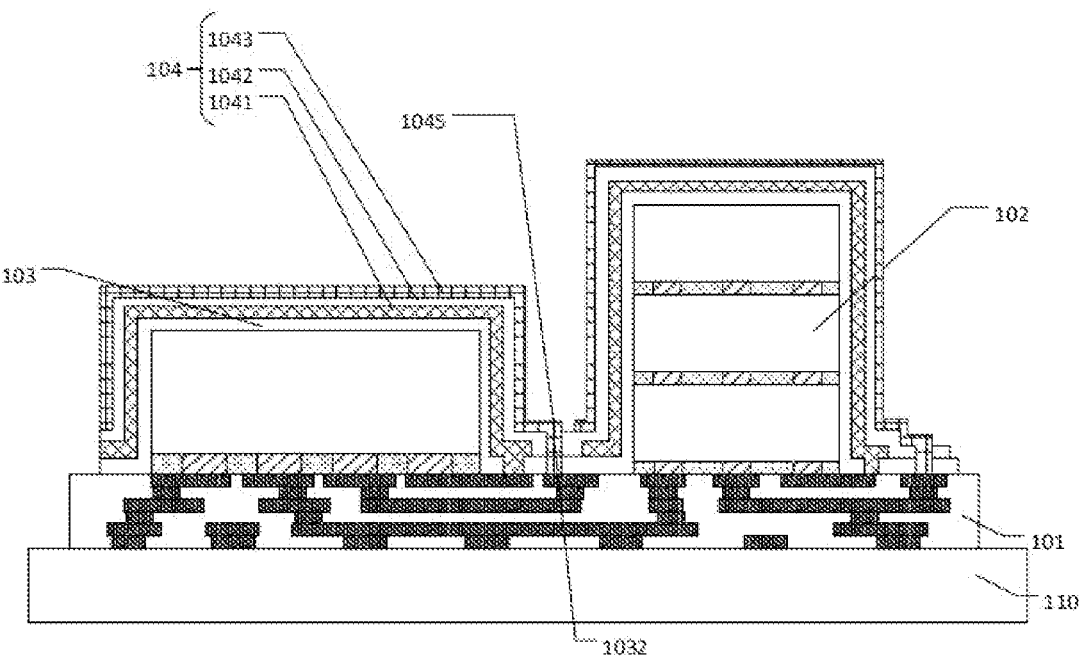
FIG. 7 is a schematic diagram of step S5 in the preparation method for the chip packaging structure provided in the embodiments of the present application.

The capacitive dielectric layer 1042 is arranged on an upper surface of the first electrode layer 1041. The second electrode layer 1043 is arranged on an upper surface of the capacitive dielectric layer 1042. The second electrode layer 1043 is electrically connected to the chip 102 via the redistribution layer 1011. Specifically, as shown in FIG. 7, the second electrode layer 1043 comprises a second connection part 1045, which is located on the lateral side of the chip 102 and is arranged opposite to the redistribution structure, and the second electrode layers 1043 on the adjacent chips 102 are separated from each other; and the chip packaging structure further comprises second connectors 1032, each of which extends through both the capacitive dielectric layer 1042 and the insulating layer 103 and is located at the bottom of the second connection part 1045, wherein one end of the second connector 1032 is connected to the second connection part 1045, and the other end of the second connector 1032 is connected to the redistribution layer 1011.

Figure 8:
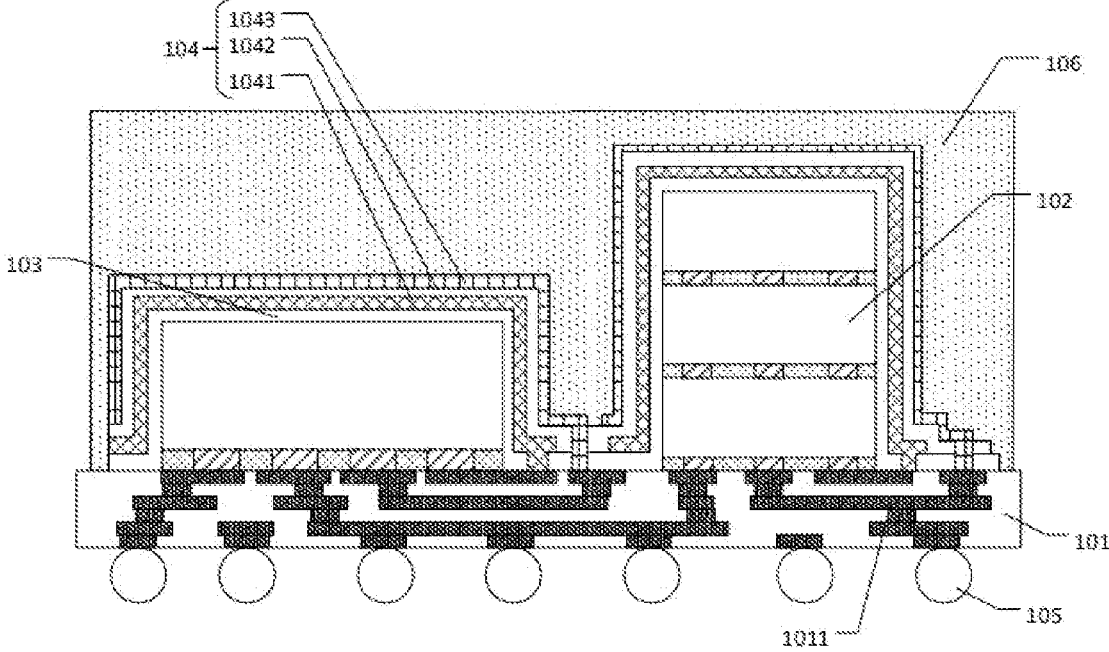
FIG. 8 is a schematic diagram of step S6 in the preparation method for the chip packaging structure provided in the embodiments of the present application.

In one embodiment, as shown in FIG. 8, the chip packaging structure 100 further comprises a packaging layer 106, which is arranged on the substrate 101 and the capacitor structure 104. The packaging layer 106 is prepared by means of compression molding, and the material of the packaging layer 106 comprises an epoxy resin plastic packaging material.

The solder balls 105 are arranged on a side of the substrate 101 facing away from the chips 102. The solder balls 105 are made of tinned balls. The solder balls 105 are connected to the redistribution layer 1011. The solder balls 105 are connected to a power source module, the power source module is configured to output a power source signal to some of the solder balls, and the power source module is configured to output a grounding signal to some of the solder balls.

The present invention provides a chip packaging structure 100 in which a capacitor structure 104 is packaged on a surface and a lateral wall of a chip 102 such that the packaging area of a capacitor is increased, thereby increasing the capacitance thereof.

The present invention provides a chip packaging structure. A capacitor structure is packaged on a surface and a lateral wall of a chip, such that the level of integration of the chip is increased. In the present application, a first electrode layer, a second electrode layer and a capacitive dielectric layer all extend along a surface on a side of the chip facing away from the substrate and along a lateral wall of the chip. Therefore, a larger relative area of the first electrode layer and the second electrode layer can be obtained, which can improve the capacity of a capacitor.

The present application further provides a preparation method for the chip packaging structure, comprising the following steps S1-S7.

Figure 2:
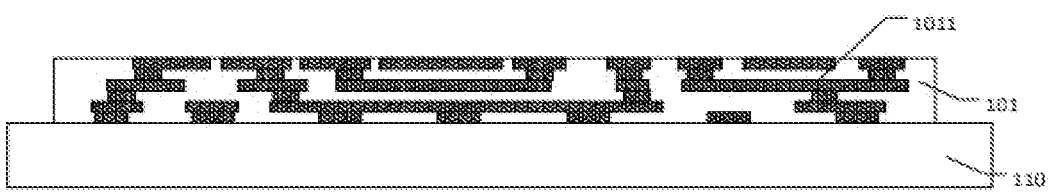
FIG. 2 is a schematic diagram of step S2 in the preparation method for the chip packaging structure provided in the embodiments of the present application.

Step S1, as shown in FIG. 2, provide a temporary carrier 110 and chips 102.

Step S2, continuing to refer to FIG. 2, prepare a substrate 101 on the temporary carrier 110, wherein the substrate 101 comprises a redistribution structure; in step S2, a redistribution layer (RDL) 1011 is prepared on the temporary carrier 110 by means of a wafer-level lithography and electroplating process, and the material of the redistribution layer 1011 comprises copper (Cu); and a dielectric layer is prepared on the temporary carrier 110 and coats the redistribution layer 1011, and the materials of the dielectric layer comprise a polyimide (PI) material, polybenzoxazole (PBO) and benzocyclobutene (BCB).

Step S3, referring to FIG. 3, surface-mount the chips 102 on the substrate 101 in an upside down manner. The chips 102 comprise a first chip 1021 and a second chip 1022. The first chip 1021 is of a single-layer chip structure, a plurality of first solder pads 1023 are provided on the front of the first chip 1021, the first solder pads 1023 are connected to the substrate 101, and a first adhesive layer 1024 is filled between the first solder pads 1023 and the substrate 101. The second chip 1022 is of a stacked chip structure and comprises a plurality of stacked second sub-chips, second solder pads 1025 are provided on the front of the second sub-chip, adjacent second sub-chips are electrically connected via connectors that are arranged in the second sub-chips, and two ends of the connector are respectively connected to the second solder pads 1025 of the adjacent second sub-chips. A second adhesive layer 1026 is also filled between adjacent second sub-chips. In the figure, a three-layer silicon-based chip stack design is shown, and the second sub-chip at the bottommost layer is connected to the substrate 101 via the second solder pads 1025.

Figure 4:
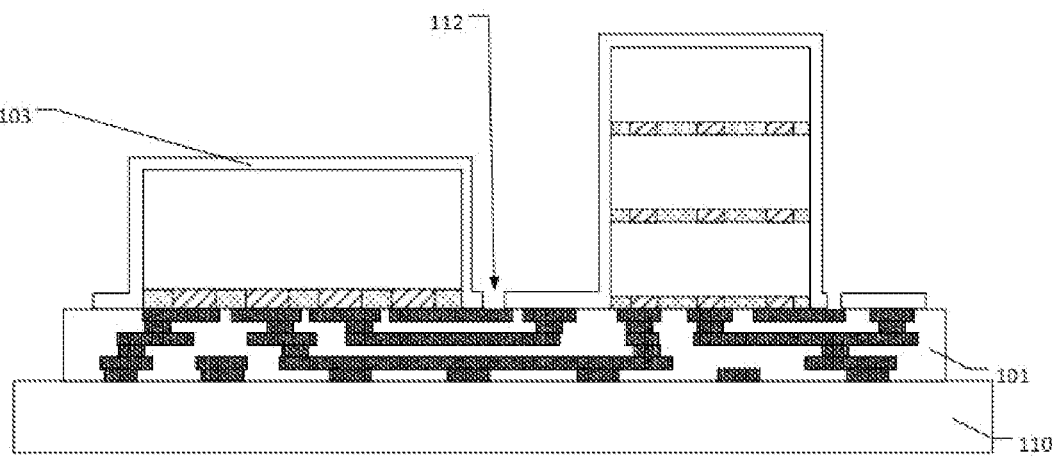
FIG. 4 is a schematic diagram of step S4 in the preparation method for the chip packaging structure provided in the embodiments of the present application.

Step S4, referring to FIG. 4, prepare an insulating layer 103. The insulating layer 103 is prepared by means of a vacuum lamination process in which a material in the form of a thin film is directly arranged. The insulating layer 103 covers the lateral wall of the chip 102 and the surface on the side of the chip 102 facing away from the substrate 101 and extends to the surface of part of the redistribution structure on the lateral side of the chip 102. A first through hole 112 is etched in the insulating layer 103 on the lateral side of the chip 102, a first connector 1031 is formed in the first through hole 112, and the first connector 1031 is connected to the redistribution layer 1011. The materials of the insulating layer 103 comprise a polyimide (PI) material, polybenzoxazole (PBO), and benzocyclobutene (BCB).

Step S5, prepare a capacitor structure 104. Step S5 specifically comprises the following steps: S501, referring to FIG. 5, preparing a first electrode layer 1041 on a surface of the insulating layer 103, which specifically comprises: depositing the first electrode layer 1041 on the surface of the insulating layer 103, and disconnecting the first electrode layers 1041 between adjacent chips 102 by means of etching, wherein the first electrode layer 1041 extends along the surface on the side of the chip 102 facing away from the substrate 101 and along the lateral wall of the chip 102, the first electrode layer 1041 is prepared by means of sputtering, electroplating, etc., the first electrode layer 1041 comprises a first connection part 1044 that is located on the lateral side of the chip 102, is arranged opposite to the redistribution structure, and is located on a surface of the first connector 1031, and the material of the first electrode layer 1041 comprises a metal material such as aluminum (Al) and copper (Cu); S502, referring to FIG. 6, preparing a capacitive dielectric layer 1042, wherein the capacitive dielectric layer 1042 extends along the surface on the side of the chip 102 facing away from the substrate 101 and along the lateral wall of the chip 102, the capacitive dielectric layer 1042 is prepared by a vacuum lamination process, and the capacitive dielectric layer 1042 extends to the surface of part of the insulating layer 103 on the lateral side of the chip 102; a second through hole 113 extending through both the insulating layer 103 and the capacitive dielectric layer 1042 is formed in the capacitive dielectric layer 1042 on the lateral side of the chip 102, a second connector 1032 is formed in the second through hole 113, and the second connector 1032 is connected to the redistribution layer 1011; and the capacitive dielectric layer 1042 can be made of epoxy resin, PI, BCB, PBO and other organic films; S503, referring to FIG. 7, preparing a second electrode layer 1043, specifically, depositing the second electrode layer 1043 on the surface of the capacitive dielectric layer 1042, and disconnecting the second electrode layers 1043 between adjacent chips 102 by means of etching, wherein the second electrode layer 1043 extends along the surface on the side of the chip 102 facing away from the substrate 101 and along the lateral wall of the chip 102, the second electrode layer 1043 is prepared by means of sputtering, electroplating, etc., the second electrode layer 1043 comprises a second connection part 1045, which is located on the lateral side of the chip 102, is arranged opposite to the redistribution structure, and is located on a surface of the second connector 1032. The second electrode layer 1043 is prepared from a metal material such as aluminum (Al) and copper (Cu).

Step S6, referring to FIG. 8, prepare a packaging layer 106 on the substrate 101 and the capacitor structure 104, wherein the packaging layer 106 is prepared by means of compression molding, and the material of the packaging layer 106 comprises epoxy resin.

Step S7, referring to FIG. 8, remove the temporary carrier 110 and attach balls to the back of the substrate 101 to form solder balls 105, wherein the material of the solder balls 105 comprises tinned balls.

The present invention provides a packaging method for a chip packaging structure. A capacitor structure is packaged on a surface and a lateral wall of a chip, and the capacitor structure is applied in the packaging, thereby improving the level of integration of the chip. In the present application, a first electrode layer, a second electrode layer and a capacitive dielectric layer all extend along a surface on a side of the chip facing away from the substrate and along the lateral wall of the chip. Therefore, a larger relative area of the first electrode layer and the second electrode layer can be obtained, which can improve the capacity of a capacitor.

Apparently, the above-described embodiments are merely examples for clarity of illustration, but are not intended to limiting the embodiments. Other changes or variations in different forms may be made by a person of ordinary skill in the art on the basis of the above description. All embodiments are not necessary to be and cannot be exhaustively listed herein. The obvious changes or variations derived therefrom still fall within the scope of protection of this application.

The invention claimed is:

1. A chip packaging structure, wherein the structure comprises:

a substrate;

a chip, which is arranged on the substrate; and a capacitor structure, which comprises a first electrode layer and a second electrode layer that are arranged opposite to each other and a capacitive dielectric layer that is located between the first electrode layer and the second electrode layer, wherein the first electrode layer, the second electrode layer and the capacitive dielectric layer all extend along a surface on a side of the chip facing away from the substrate and along a lateral wall of the chip.

2. The chip packaging structure according to claim 1, wherein the capacitor structure forms a decoupling capacitor; the first electrode layer is configured to receive a power source signal, and the second electrode layer is configured to receive a grounding signal; or the second electrode layer is configured to receive a power source signal, and the first electrode layer is configured to receive a grounding signal.

3. The chip packaging structure according to claim 1, wherein the substrate comprises a redistribution structure, and the redistribution structure comprises a redistribution layer; the first electrode layer is electrically connected to the chip via the redistribution layer; and the second electrode layer is electrically connected to the chip via the redistribution layer.

4. The chip packaging structure according to claim 3, wherein the structure further comprises:

an insulating layer, which covers the lateral wall of the chip and the surface on the side of the chip facing away from the substrate and extends to a surface of part of the redistribution structure on a lateral side of the chip, wherein the insulating layer is located between the capacitor structure and the chip; and the first electrode layer is located between the insulating layer and the capacitive dielectric layer.

5. The chip packaging structure according to claim 4, wherein the first electrode layer comprises a first connection part, which is located on the lateral side of the chip and is arranged opposite to the redistribution structure; and the chip packaging structure further comprises a first connector, which extends through the insulating layer and is located at the bottom of the first connection part, wherein one end of the first connector is connected to the first connection part and the other end thereof is connected to the redistribution layer.

6. The chip packaging structure according to claim 4, wherein the second electrode layer comprises a second connection part, which is located on the lateral side of the chip and is arranged opposite to the redistribution structure; and the chip packaging structure further comprises a second connector, which extends through both the capacitive dielectric layer and the insulating layer and is located at the bottom of the second connection part, wherein one end of the second connector is connected to the second connection part and the other end thereof is connected to the redistribution layer.

7. The chip packaging structure according to claim 3, wherein the structure further comprises solder balls, which are arranged on a side of the redistribution structure facing away from the chip.

8. The chip packaging structure according to claim 7, wherein the chip is connected to the solder balls via the redistribution layer, the solder balls are connected to a power source module, the power source module is configured to output a power source signal to some of the solder balls, and the power source module is configured to output a grounding signal to some of the solder balls.

9. The chip packaging structure according to claim 1, wherein the chip is mounted upside down on the substrate.

\* \* \* \* \*